US009508912B2

United States Patent
Baniecki et al.

(10) Patent No.: US 9,508,912 B2
(45) Date of Patent: Nov. 29, 2016

(54) THERMOELECTRIC CONVERSION DEVICE HAVING PEROVSKITE CRYSTAL INCLUDING GRAIN DOMAIN

(71) Applicant: FUJITSU LIMITED, Kawasaki-shi, Kanagawa (JP)

(72) Inventors: John David Baniecki, Zama (JP); Yasutoshi Kotaka, Sagamihara (JP); Masatoshi Ishii, Kawasaki (JP); Kazuaki Kurihara, Atsugi (JP); Kazunori Yamanaka, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 16 days.

(21) Appl. No.: 14/449,260

(22) Filed: Aug. 1, 2014

(65) Prior Publication Data
US 2014/0338717 A1 Nov. 20, 2014

Related U.S. Application Data

(63) Continuation of application No. PCT/JP2012/052283, filed on Feb. 1, 2012.

(51) Int. Cl.
| | | |
|---|---|---|
| H01L 35/20 | (2006.01) | |
| H01L 35/32 | (2006.01) | |
| H01L 35/22 | (2006.01) | |
| H01L 35/34 | (2006.01) | |
| C23C 14/08 | (2006.01) | |
| C04B 35/47 | (2006.01) | |

(52) U.S. Cl.
CPC ............ *H01L 35/20* (2013.01); *C04B 35/47* (2013.01); *C23C 14/088* (2013.01); *H01L 35/22* (2013.01); *H01L 35/32* (2013.01); *H01L 35/34* (2013.01); *C04B 2235/3227* (2013.01); *C04B 2235/3251* (2013.01); *C04B 2235/768* (2013.01); *C04B 2235/78* (2013.01); *C04B 2235/787* (2013.01)

(58) Field of Classification Search
CPC ....... H01L 35/20; H01L 35/22; H01L 35/32; H01L 35/34
See application file for complete search history.

(56) References Cited

U.S. PATENT DOCUMENTS

2011/0298080 A1* 12/2011 Hiroyama .................... 257/467
2012/0227780 A1 9/2012 Kurihara et al.

FOREIGN PATENT DOCUMENTS

| JP | 2010-161213 | 7/2010 |
| WO | 2011065185 | 6/2011 |

OTHER PUBLICATIONS

"Thermoelectric Properties of Y-Doped Polycrystalline SrTiO3", Obara et al., Jap. Journal of App. Phys., vol. 43, pp. L540-L542, 2004.*
JPOA—Office Action mailed on Apr. 14, 2015 issued with respect to the basic Japanese Patent Application No. 2013-556145, with partial English translation.

(Continued)

*Primary Examiner* — Kevin Parendo
(74) *Attorney, Agent, or Firm* — Fujitsu Patent Center

(57) ABSTRACT

A thermoelectric conversion device includes a perovskite film over a substrate and formed with first and second electrodes on the perovskite film, wherein the perovskite film includes a domain having a crystal orientation different from a crystal orientation of a crystal that constitutes the perovskite film.

6 Claims, 14 Drawing Sheets

(56) References Cited

OTHER PUBLICATIONS

J. D. Baniecki et al., "Electronic Transport Behavior of Off-Stoichiometric La and Nb Doped SrxTiyO3-δ, Epitaxial Thin Films and Donor Doped Single-Crystalline SrTiO3", [online], Dec. 6, 2011, AIP Publishing LLC, [retrieved Apr. 6, 2015], Internet <URL: ftp://ftp.aip.org/epaps/appl_phys_lett/E-APPLAB-99-095148/, FILE: Supplemental_11-5_B.doc>.

JPOA—Office Action maited on Apr. 14, 2015 issued with respect to the basic Japanese Patent Application No. 2013-556145, with partial English translation.

J. D. Baniecki et al., "Electronic Transport Behavior of Off-Stoichiometric La and Nb Doped SrxTiyO3-δ, Epitaxial Thin Films and Donor Doped Single-Crystalline SrTiO3", [online], Dec. 6, 2011, AIP Publishing LLC, [retrieved Apr. 6, 2015], Internet <URL: ftp://ftp.aip.org/epapa/appl_phys_lett/E-APPLAB-99-095148/, FILE: Supplemental_11-5_B.doc>.

Davd G. Cahill, "Thermal conductivity measurement from 30 to 750K: the 3ω method", Rev. Sci. Instrum. vol. 61, No. 2, Feb. 1990, pp. 802-808.

David G. Cahill et al., "Thermal conductivity of α-Si:H thin films", Physical Review B, vol. 50, No. 9, Sep. 1, 1994—I, pp. 6077-6081.

J. Ravichandran et al., High-temperature thermolectric response of double-doped SrTiO3 epitaxial films, Physical Review B 82, 165126-1-165126-5 (2010).

J.D. Baniecki et al., Composition-Thermoelectric Property Relationships of Sputter Deposited Epitaxial, SrxLayTimNbuO3-δ Thin Films, Dai 58 Kai, Extended Abstracts, Japan Society of Applied Physics and Related Societies, Mar. 9, 2011 (2 pages).

Shingo Ohta et al., Large thermoelectric performance of heavily Nb-doped SrTiO3 epitaxial film at high temperature, Applied Physics Letters 87, 092108 (2005) (3 pages).

International Search Report of Int. Appl. No. PCT/JP2012/052283 dated Mar. 27, 2012 (2 pages).

JPOA—Office Action mailed on Mar. 8, 2016 issued with respect to the basic Japanese Patent Application No. 2013-556145, with partial English translation office action.

K. Koumoto et al., "Oxide Thermoelectric Materials: A Nanostructuring Approach", Annual Review of Materials Research, Annual Reviews, Feb. 19, 2010, vol. 40, p. 363-394.

JPOA—Office Action mailed on Oct. 4, 2016 issued with respect to the corresponding Japanese Patent Application No. 2013-556145, with partial English translation.

\* cited by examiner

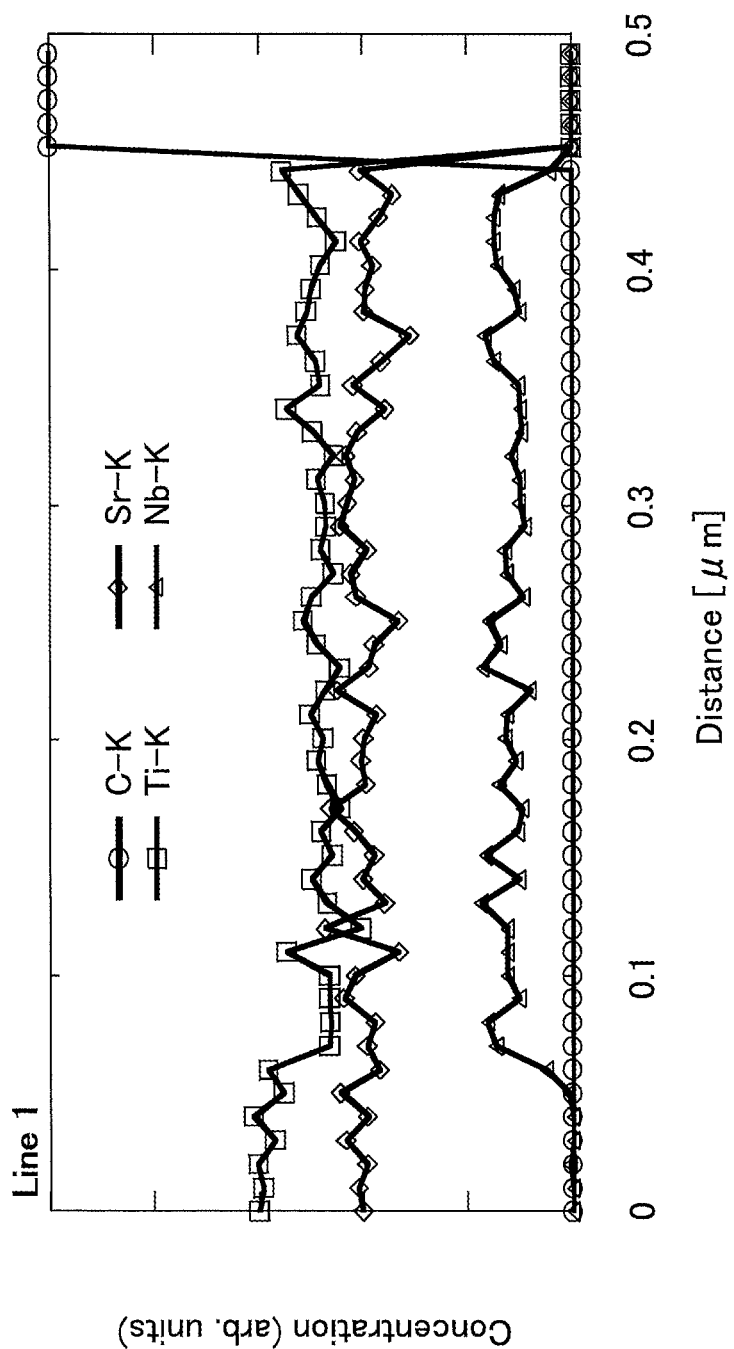

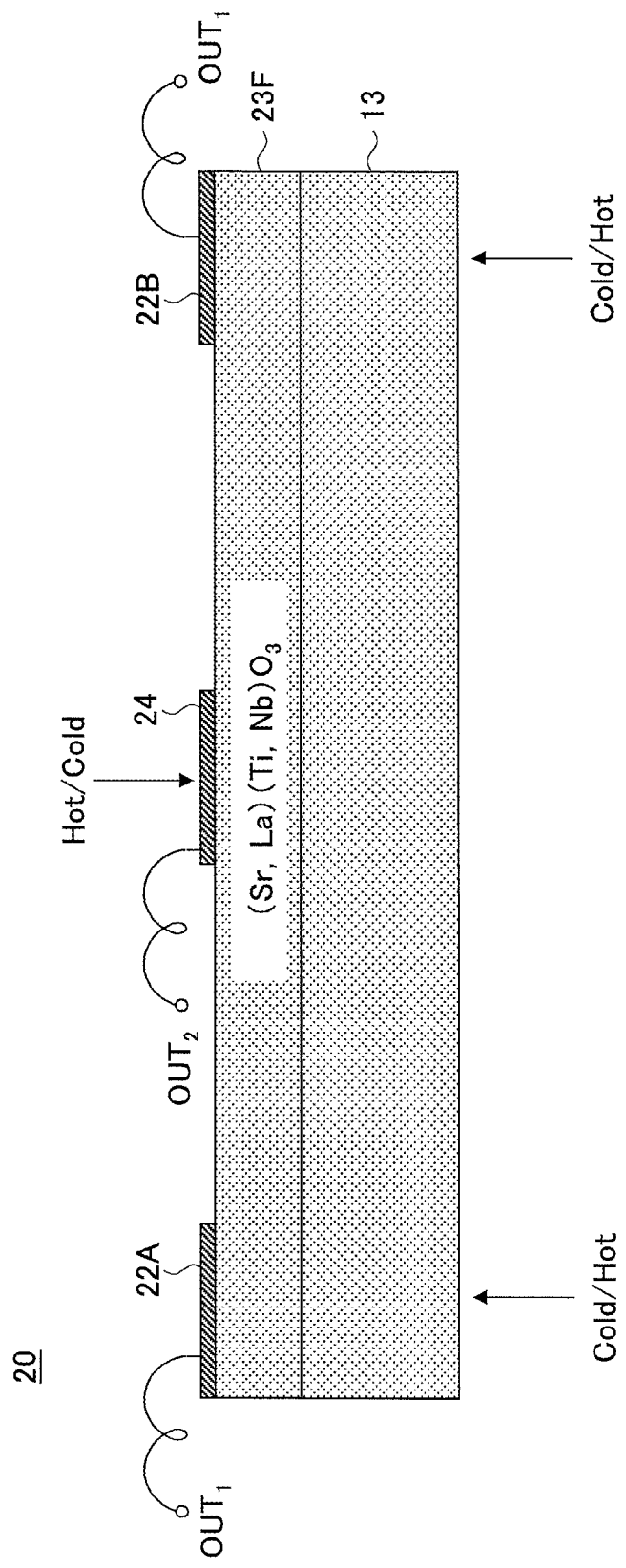

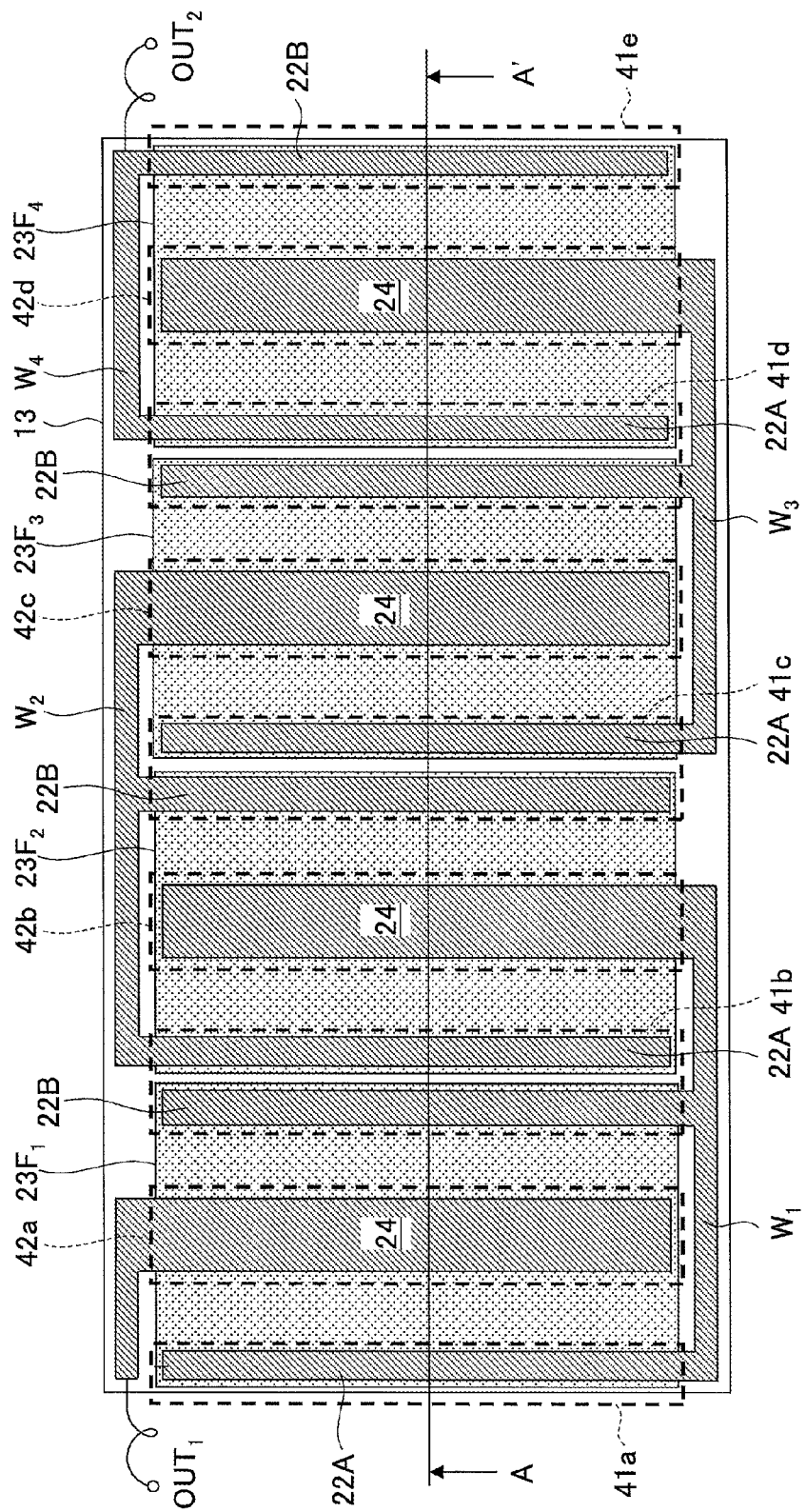

THERMOELECTRIC CONVERSION DEVICE HAVING PEROVSKITE CRYSTAL INCLUDING GRAIN DOMAIN

CROSS-REFERENCE TO RELATED APPLICATIONS

This application is a continuation application of International Application PCT/JP2012/052283 filed on Feb. 1, 2012 and designated the U.S., the entire contents of which are incorporated herein by reference.

FIELD

The embodiments described herein generally relate to thermoelectric conversion devices and fabrication method thereof.

BACKGROUND

Up to now, energies are emitted, after being used in factories and power plants, in transportation vehicles like automobiles, and also in information processing devices like computers, into the environment in the form of waste heat. Thus, thermoelectric conversion devices capable of recycling and converting such waste heat again to energy attract extensive attention.

A thermoelectric conversion device of the type that uses Seebeck effect is capable of recovering and converting waste heat of various systems to electric power while not needing working fluids or complex driving mechanisms, in contrast to other conventional thermoelectric conversion systems.

Particularly, strontium titanate (hereinafter "STO"), which has been much studied conventionally in relation to ferroelectric devices, is free from rare or toxic materials such as tellurium, bismuth, and the like used in conventional thermoelectric conversion devices and at the same time is capable of providing a large Seebeck coefficient S that reaches as much as 0.8 mVK$^{-1}$ at 300K and further a power factor, defined as $S^2\sigma$ (PF=$S^2\sigma$), of 30-40 µW/cm·K$^2$. Thus use of STO as the material for a thermoelectric conversion device draws much attention. Here σ stands for electrical conductivity of the thermoelectric conversion device. The power factor PF can also be represented also as $S^2qn\mu$ (PF=$S^2\sigma$=$S^2$ qnµ), wherein n stands for carrier concentration per unit volume, q stands for carrier electric charge and µ stands for carrier mobility.

However, in the system of STO, while the power factor PF can reach the value of 35 µW/cm$^2$K-40 µW/cm$^2$K, a thermal conductivity κ takes a large value of 11 WmK when the STO is used in the form of a bulk crystal, and the value of performance index ZT defined by $$ZT = \frac{S^2 T}{\rho \kappa} \qquad \text{Eq. (1)}$$

is rather limited. In Eq. (1), it should be noted that T is the absolute temperature, S is the Seebeck coefficient of STO, ρ is the resistivity of STO and κ is the thermal conductivity of STO.

Thus, in order to attain a large performance index ZT for such a thermo-electric conversion device of STO, it is necessary to form the STO to have a high electric conductivity and at the same time low thermal conductivity κ.

RELATED-ART DOCUMENTS

[Patent Reference 1]
  Japanese Laid-Open Patent Publication 2010-161213
[Non-Patent Reference 1]
  Cahill, D. Rev. Sci. Instrum. 61(2), February 1990, pp 802-808
[Non-Patent Reference 2]
  Cahill, D., et al. Phys. Rev. B Vol. 50, Number 9, 6077-6081 (1994)
[Non-Patent Reference 3]
  Ravichandran, J., et al., Phys. Rev. B 82, 165126 (2010)

SUMMARY

In a first aspect, there is provided a thermoelectric conversion device that includes: a substrate; a film of a compound having perovskite structure formed over the substrate; a first electrode formed over the substrate in contact to a top surface of the film at a first region; a second electrode formed in contact with the top surface of the film at a second region offset from the first region; a first heating or cooling part heating or cooling said film at the first region; and a second heating or cooling part cooling or heating the film at the second region, the second heating and cooling part cooling the second region of the film when the first heating or cooling part heats the first region of the film, the second heating and cooling part heating the second region of the film when the first heating or cooling part cools the first region of the film, wherein the film includes, in a crystal that constitutes the compound having perovskite structure, a domain having a crystal orientation different from a crystal orientation of the crystal that constitutes the compound having perovskite structure.

According to an aspect of the present embodiment, there are formed a plurality of domains of crystal orientation different from that of the matrix in the perovskite thin film, and thus, there is induced scattering of phonons by the dislocations at the domain boundaries. As a result, the thermal conductivity of the perovskite thin film is reduced and the performance index ZT of the thermo-electric conversion device is improved.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 8A is a diagram representing a compositional profile taken along Line 1 of FIG. 7;

FIG. 11 is a cross-sectional diagram representing the construction of the thermoelectric conversion device of the first embodiment;

FIG. 12A is a plan view diagram representing the construction of a thermoelectric conversion device of a second embodiment;

DESCRIPTION OF EMBODIMENTS

In the following, embodiments will be described with reference to the accompanying drawings.

First Embodiment

Figure 1:
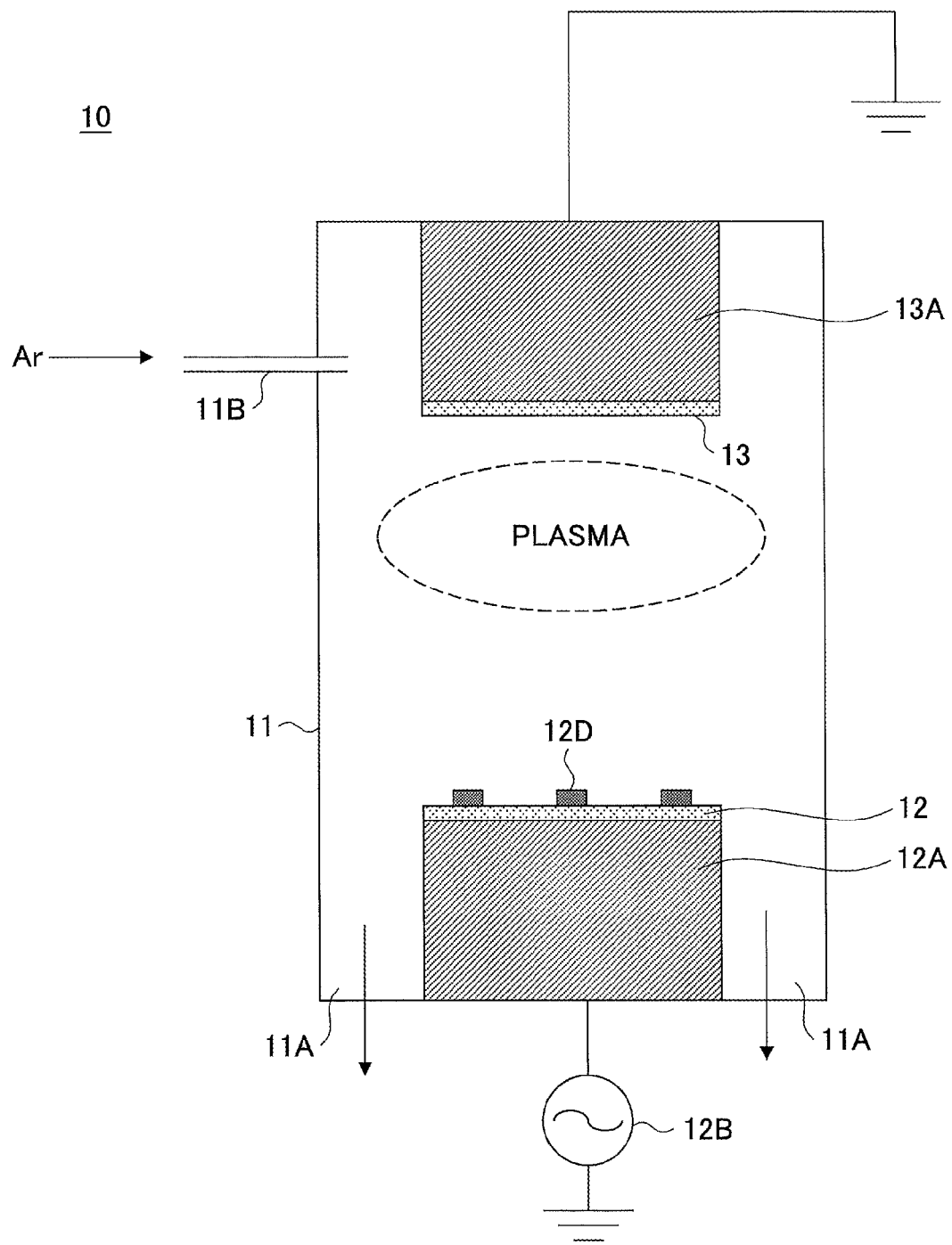
FIG. 1 is a schematic cross-sectional diagram representing a sputtering apparatus used in a first embodiment.

FIG. 1 is a diagram representing the construction of a sputtering apparatus 10 used for forming an STO film in a first embodiment. It should be noted, however, that formation of the STO film for the present embodiment is not limited to the sputtering apparatus 10 of FIG. 1. Thus the STO film can be formed also by other PVD method such as pulsed laser deposition method, for example.

Referring to FIG. 1, the sputtering apparatus 10 includes a vacuum vessel 11 supplied with a sputtering gas of Ar or the like from a sputtering gas injection port 11B and is evacuated to high degree vacuum state from an evacuation port 11A, and there is provided a target holder 12A at a bottom of the vacuum vessel 11 for holding a target 12 of STO. Further, there is provided a substrate holder 13A holding a substrate 13 to be processed at a top part of the vacuum vessel 11, wherein the substrate 13 is held in such a matter to face the target 12.

A high frequency power supply 12B is connected to the target holder 12A, and plasma is formed in the vacuum vessel 11 between the target 12 and the substrate 13 to be processed when a high frequency power is supplied to the target 12 from the high frequency power supply 12B via the target holder 12A. The plasma thus formed cause collision to the target 12 and cause sputtering of the components of the target 12 out from the target 12.

The substrate holder 13A is grounded, and thus, the components sputtered from the target 12 are deposited on the substrate 13 held by the substrate holder 13A. With this, a desired STO film is formed on the substrate 13 to be processed.

In the sputtering apparatus 10 of FIG. 1, there are disposed metal pieces 12D of a metal element, which is to be doped to the strontium titanate film, on the target with a predetermined proportion, and with this, it becomes possible to dope the STO film on the substrate 13 with a desired metal element with a desired proportion.

Figure 2:
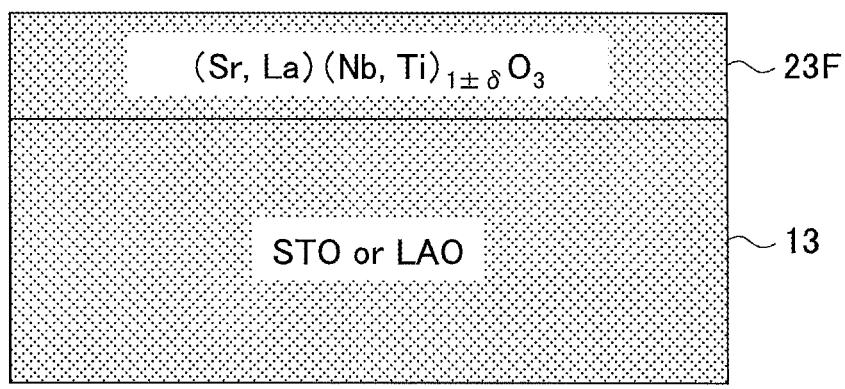
FIG. 2 is a cross-sectional diagram representing a STO film used for a thermoelectric conversion device of the first embodiment doped with La and Nb.
Figure 3:
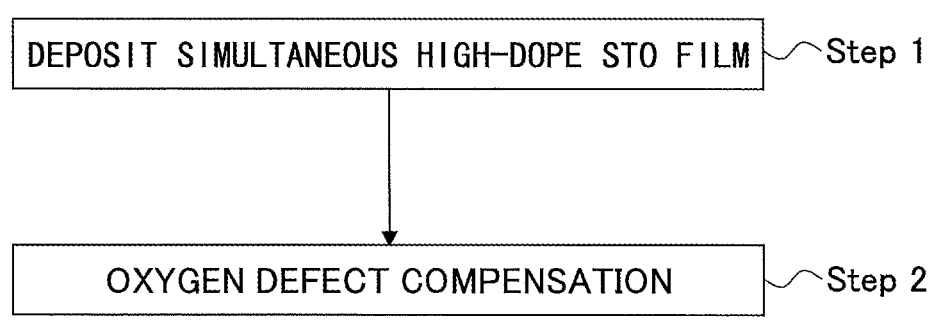
FIG. 3 is a flow chart representing the process of forming the STO film of the first embodiment.

FIG. 2 is a schematic cross-sectional diagram representing a STO film 23F of the first embodiment used for a thermoelectric conversion device, and FIG. 3 is a flowchart representing the fabrication process of the STO film 23F of FIG. 2.

Referring to FIG. 2, the STO film 23F is a film having a stoichiometric composition or a non-stoichiometric composition having oxygen defects and has a film thickness in the range of 1 nm-10 μm, preferably 10 nm-1000 nm and has a composition represented by a general formula of $(Sr, La)(Nb, Ti)_{1\pm\delta}O_3$ by being doped concurrently with La in the A-site and Nb in the B-site of perovskite structure.

In one example, the A-site and the B-site of the STO film 23F are doped with La and Nb respectively such that the ratio, and hence atomic concentration, of the total of La and Nb to the total of the A-site and B-site, represented as (La+Nb)/(Sr+La+Ti+Nb), becomes equal to 20% or more, preferably 24% or more. The effect of such high concentration doping will be explained in detail later.

Next, referring to the flowchart of FIG. 3, a suitable substrate, such as a monocrystalline substrate 13 of strontium titanate or lanthanum aluminate ($LaAlO_3$) is used in the step 1, and a STO film 23F highly doped with La and Nb is formed thereon epitaxially in the present embodiment by using the sputtering apparatus 10.

Next, the STO film 23F thus obtained is annealed in the step 2 in an oxygen ambient for control of the oxygen defect concentration in the STO film 23F. By controlling the oxygen defect concentration in the STO film 23F to a predetermined value, there is caused increase of carrier concentration in the film and it becomes possible to reduce the resistivity ρ in Equation (1) and increase the electrical conductivity σ.

Figure 4:
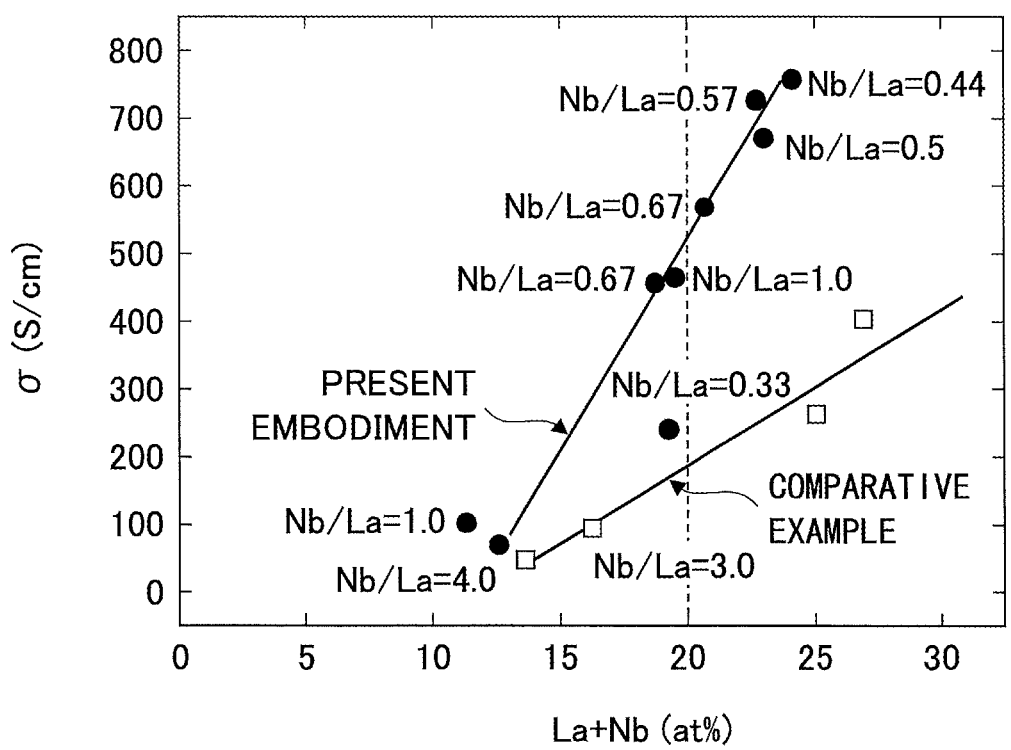
FIG. 4 is a graph representing the relationship between electric conductivity and total amount of doping for the STO film of FIG. 2.

FIG. 4 represents the Hall mobility of electrons in the STO film 23F, which is thus formed on the STO monocrystalline substrate 13 with the thickness of 300 nm and doped with La and Nb. Here, the vertical axis represents the Hall mobility while the horizontal axis represents the atomic ratio ((La+Nb)/(Sr+La+Ti+Nb)). The numerals attached to each point of FIG. 4 represent the atomic ratio Nb/La.

Referring to FIG. 4, the electric conductivity of the STO film 23F increases with increase of the total atomic concentration of Nb and La as defined above in the present embodiment, wherein this reflects the situation that there is caused increase of carrier concentration in the film as a result of the doping. Particularly, when the total atomic concentration is increased beyond 20%, it can be seen that the electric conductivity σ of the STO film 23F exceeds 700 S/cm and approaches 800 S/cm.

FIG. 4 also represents a comparative example in which doping with La is not made in the STO film 23F and doping is conducted only by Nb. It can be seen that the electrical conductivity σ of the STO film is decreased to one half or less. This suggests that, as a result of doping conducted only to the B-side, the balance in the number of atoms is lost between the A-site and the B-site contrary to the case of the perovskite-type compound of stoichiometric composition represented by $ABO_3$, resulting in formation of defects, and that the defects thus formed work as a carrier killer.

Figure 5A:
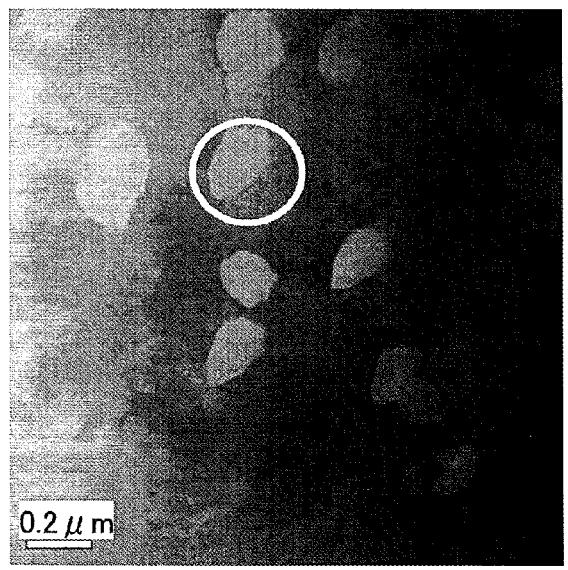
FIG. 5A is a transmission electron microscopic image of the STO film of FIG. 2 as viewed from a direction perpendicular to a film surface.
Figure 5B:
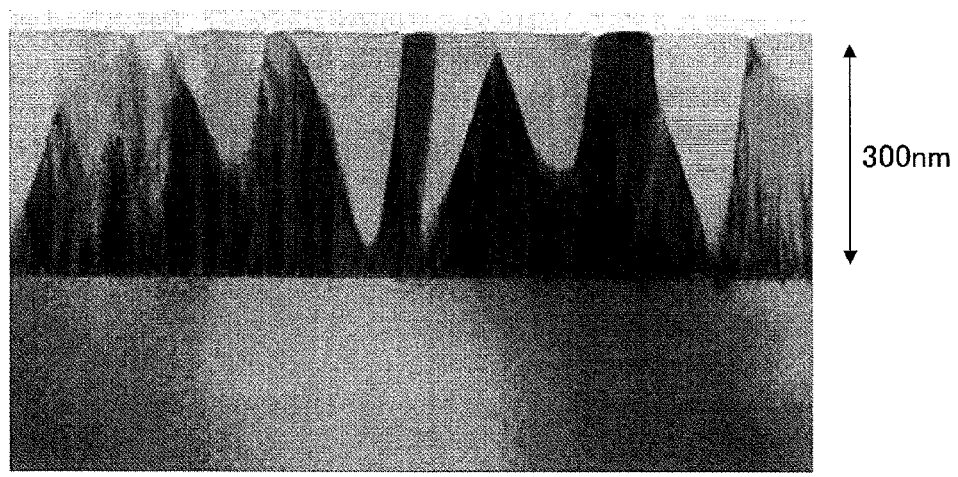
FIG. 5B is a transmission electron microscopic image representing a film cross-section of the STO film of FIG. 2.

FIGS. 5A and 5B are transmission electron microscopic images respectively representing a film top surface and a film cross-section of the STO film 23F of FIG. 2 doped simultaneously with La and Nb with the concentration exceeding 20 atomic % in total.

Referring to FIGS. 5A and 5B, such a highly doped STO film 23F is, while being a monocrystalline film, formed with a large number of whitish regions or domains of a (031) surface orientation in a dark matrix of a (001) surface orientation. The domains of the (031) surface orientation thus formed has a size of as large as 0.2 μm, and it is believed that dislocations are formed at the boundary to the matrix.

Actually, the specimen of FIGS. 5A and 5B is the one formed in the sputtering apparatus 10 of FIG. 1 by RF magnetron sputtering while using a LaAlO$_3$ (hereinafter "LAO") substrate for the substrate 13 as will be explained later with reference to Experiment 1 at a substrate temperature of 700° C. while supplying a power of 75 W in an Ar gas ambient of 1 Pa and corresponds to the STO film 23F doped with La with the concentration of 13.02 atomic % and Nb with the concentration of 8.4 atomic % at the same time.

With such a STO film 23F of the structure including domains, there is caused scattering of phonons by the dislocations existing at the domain boundaries and it is expected that the thermal conductivity κ of the film may be decreased significantly. Thus, there is a possibility of improving the performance index ZT significantly by using such an STO film 23F for the thermo-electric conversion device.

Figure 5C:
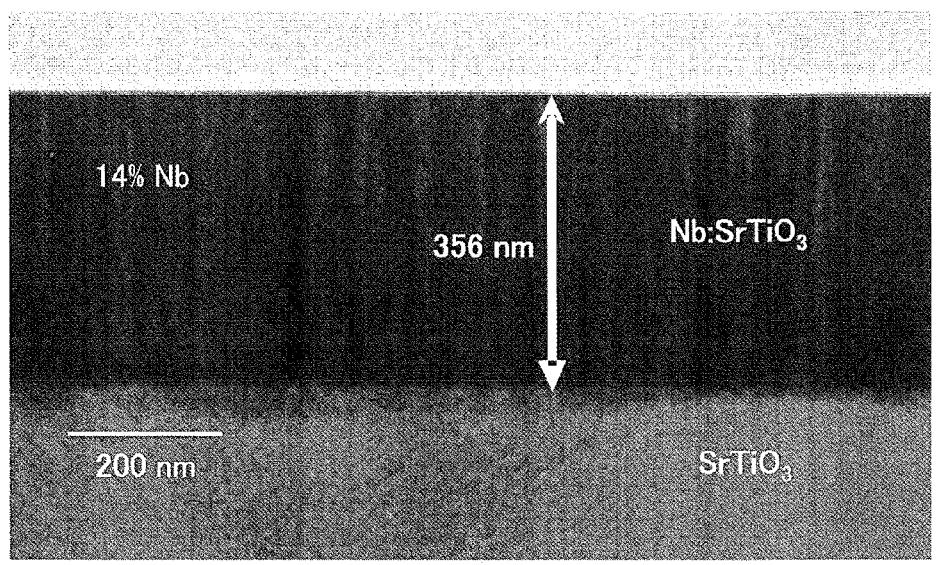
FIG. 5C is a transmission electron microscopic image representing a film cross-section of an STO film of a comparative example.

Contrary to this, FIG. 5C represents a comparative example in which the STO film 23F of FIG. 2 is doped only by Nb to the concentration of 14 atomic %. It will be noted that no conspicuous domain structure is recognized in this comparative example. As noted previously, it is confirmed that the domain structure of FIGS. 5A and 5B appears in the case La and Nb are doped simultaneously in the STO film 23F and the total dopant concentration has exceeded 20%. On the other hand, in the case only Nb is doped, a similar domain structure appears when the dopant concentration has exceeded 25%. Although there is caused decrease of carrier concentration in the film as explained previously in the case only Nb is doped with high concentration, such high concentration doping of Nb nevertheless can cause formation of the domain structure, and thus, such a case is also included in the present embodiment.

It should be noted that the specimen of FIGS. 5A and 5B is produced by disposing nine La and Nb pieces in the sputtering apparatus 10 of FIG. 1 on the target 12 for the metal piece 12D. Further, the La concentration and the Nb concentration in the film 23F are confirmed by induction-coupled plasma (ICP) spectroscopy. Likewise, in the case of the specimen of FIG. 5C, three pieces of Nb are placed in the sputtering apparatus 10 of FIG. 1 on the target 12 as the metal piece 12D, and the Nb concentration in the film 23F is confirmed also by the induction-coupled plasma (ICP) spectroscopy.

As noted previously, in the STO film that includes a large number of domains in the matrix with different crystal orientations as in the case of FIGS. 5A and 5B, it is expected that there is cased scattering of phonons by the dislocations constituting the domain boundary and the thermal conductivity κ is reduced significantly. Such decrease of thermal conductivity κ in turn functions to increase the performance index ZT explained with reference to Eq. (1).

Thus, with the present embodiment, measurement of thermal conductivity is conducted for the structure thus formed with the domains by using a 3ω method. With regard to the principle and applications of the 3ω method, reference should be made to non-Patent References 1 and 2.

Figure 6A:
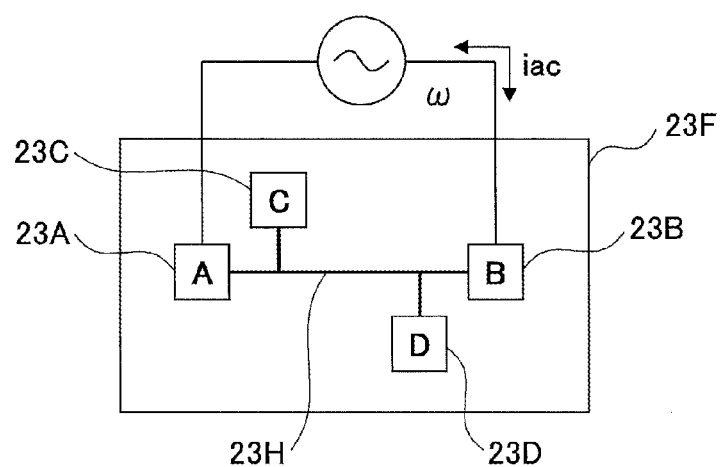
FIG. 6A is a diagram for explaining a measurement of thermal conductivity conducted according to a 3ω method.
Figure 6B:
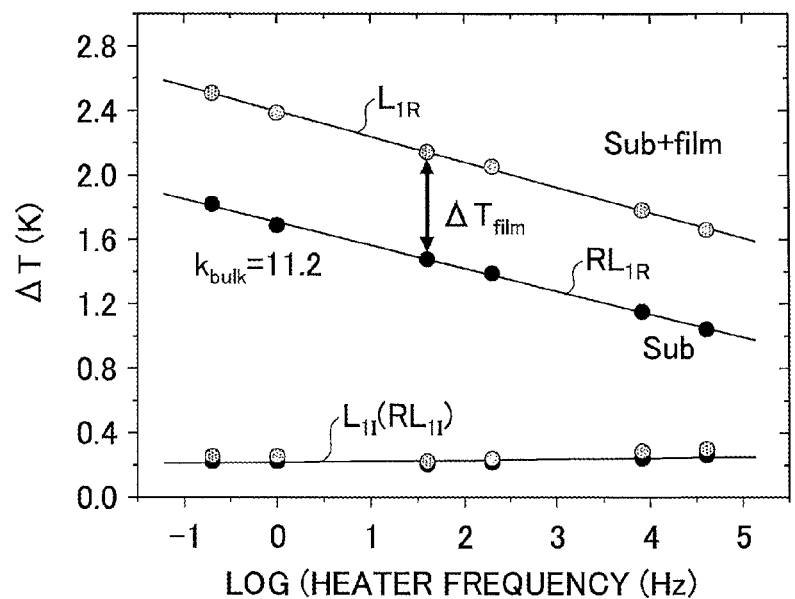
FIG. 6B is a graph representing the measurement of thermal conductivity according to the 3ω method.

FIG. 6A is a diagram representing the outline of the measurement while FIG. 6B is a graph representing the measured data.

Referring to FIG. 6A, a thin silicon oxide film (not illustrated) is formed on the STO film 23F for insulation by a sputtering process, or the like, and a line-shaped heater 23H is formed thereon by using a conductive film of a Cr/Au stacked structure. The measurement was conducted by heating the heater 23H periodically by supplying an A.C. current of the frequency ω from the terminals 23A and 23B located at the respective ends.

By supplying the A.C. current to the heater 23H with the frequency ω, the specimen is heated repeatedly with the frequency of 2ω. Thus, the resistance of the heater 23H is measured by applying a voltage of the frequency 3ω between terminals 23C and 23D located between the terminals 23A and 23B, and a temperature oscillation ΔT of the specimen is obtained based on the measured resistance value. Here, the heater 23H is used also as a thermometer. Such a temperature oscillation ΔT is caused by the diffusion of heat along the plane of the specimen, which is heated periodically, and includes the information about thermal conductivity κ.

In FIG. 6B, the lines $L_{1R}$ and $L_{1I}$ represent the relationship between the temperature oscillation ΔT and a logarithm of the heating frequency ω obtained for the specimen of FIG. 2, wherein the line $L_{1R}$ represents the real part of the temperature oscillation ΔT, which is in-phase with the heating cycle and forms a straight line to the logarithm of the heating frequency ω. Further, the line $L_{1I}$ represents the imaginary part of the temperature oscillation ΔT, which is in anti-phase to the heating cycle and is constant with regard to the heating frequency ω.

Further, in FIG. 6B, the lines $RL_{1R}$ and $RL_{1I}$ are the lines representing the temperature oscillation ΔT and the logarithm of the heating frequency ω of the STO substrate 13, which is not formed with the STO film 23F in the specimen of FIG. 2, and thus, the electrodes of FIG. 6A are formed directly on the STO substrate 13. Here again, the line $RL_{1R}$ represents the real part of the temperature oscillation ΔT, which is in phase with the heating cycle and forms a straight line to the logarithm of the heating frequency ω. Further, the line $RL_{1I}$ represents the imaginary part of the temperature oscillation ΔT, which is in anti-phase with regard to the heating cycle and is constant with regard to the heating frequency ω.

In FIG. 6B, the thermal conductivity κ for the STO substrate 13 ("Sub") is calculated based on the slope of the line $RL_{1R}$ and the value of 11.2 mW/mK is obtained, wherein this value is in agreement with the known value of the thermal conductivity of an STO bulk crystal.

On the other hand, with the specimen in which the STO film 23F is formed on the STO substrate 13, it can be seen that the line $L_{1R}$ is parallel to the line $RL_{1R}$ but is shifted in the upward direction by about 0.7K, wherein this shift $\Delta T_{film}$ corresponds to the contribution of the STO film 23F to the thermal conductivity κ. This shift $\Delta T_{film}$ is independent to the heating frequency ω, while this corresponds to the situation in which lateral spreading of the heat in the specimen is negligible in view of the small film thickness of the film 23F.

By using a one-dimensional thermal conduction equation, a value of 2 W/mK is obtained for the thermal conductivity κ from the shift $\Delta T_{film}$. This value is far smaller than the thermal conductivity of an STO bulk crystal ($\kappa_{bulk}$) and further less than one half of the value of 4 W/mK-5 W/mK reported conventionally for an STO film (non-Patent Reference 3).

It is believed that, with the STO film 23F of the present embodiment, in which the domain structure explained previously with reference to FIGS. 5A and 5B is included, there occurs increased phonon scattering in the film and this increased phonon scattering works to decrease the thermal conductivity κ as compared with the STO film of the non-Patent Reference 3.

Hereinafter, some experiments will be explained.

Experiment 1

In Experiment 1, an LAO substrate is used for the substrate 13 as noted before, and the STO film 23F of the (001) surface orientation doped with La and Nb simultaneously is formed in the sputtering apparatus 10 at the substrate temperature of 700° C. in an Ar ambient of reduced pressure by an RF sputtering method while supplying an RF power of 75 W.

In the state in which no thermal annealing process is applied after the film formation, the STO film 23F is doped by La with a concentration of 13.2 atomic %, Nb with a concentration of 8.4 atomic % and oxygen vacancy with the concentration of 16.2% per unit cell.

As explained previously with reference to FIGS. 5A and 5B, the STO film 23F is formed with a large number of domains of the (031) surface orientation in the perovskite matrix of the (001) surface orientation in the form of islands, and it was confirmed that the thermal conductivity κ of the STO film 23F is reduced to 2 W/mK as explained with reference to FIGS. 6A and 6B.

Figure 7:
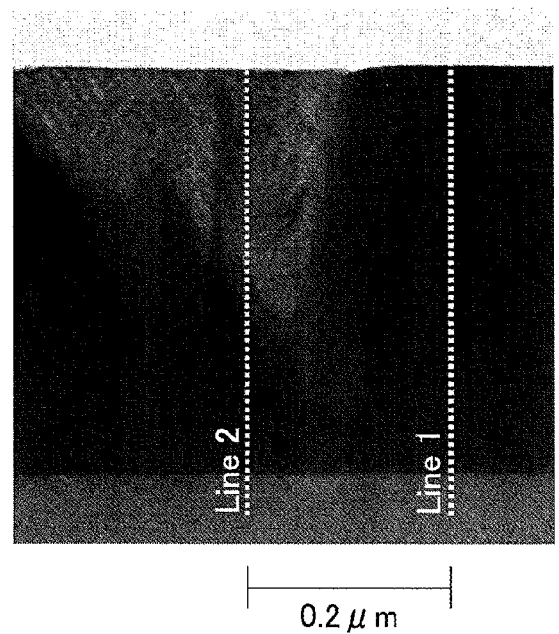
FIG. 7 is a diagram explaining an experiment for confirming uniformity of the STO film of FIG. 2.
Figure 8B:
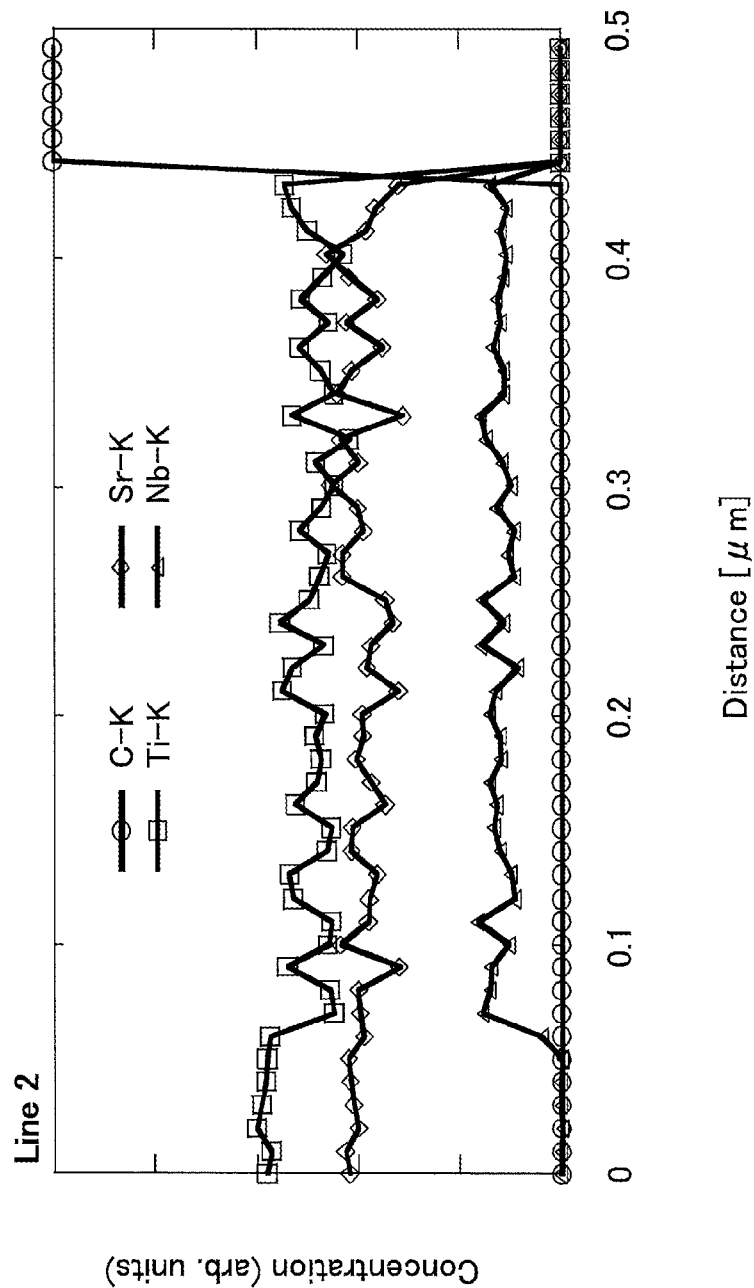
FIG. 8B is a diagram representing a compositional profile taken along Line 2 of FIG. 7.
Figure 8C:
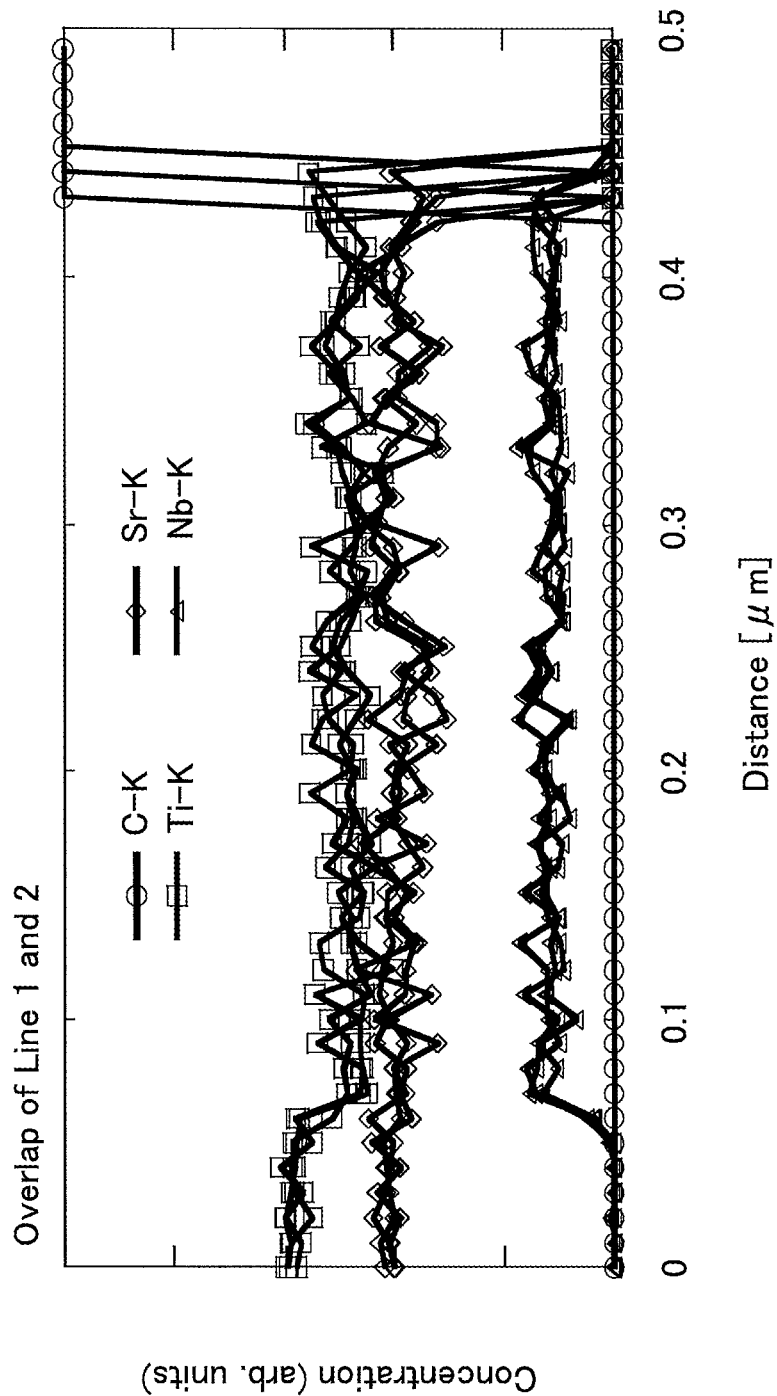
FIG. 8C is a diagram in which the profiles of FIGS. 8A and 8B are superimposed.

Further, compositional profile was obtained for the STO film 23F thus obtained with regard to C (carbon), Sr, T and Nb in the film along the lines LINE 1 and LINE 2 shown in FIG. 7, and the results represented in FIGS. 8A and 8B were obtained. Here, it should be noted that FIG. 7 is a transmission electron microscopic image of the film 23F as viewed perpendicularly to the film surface, while FIG. 8A is a compositional profile along the LINE 1 of FIG. 7 and FIG. 8B is a compositional profile along the LINE 2 of FIG. 7. Further, FIG. 8C superimposes FIGS. 8A and 8B. The line Line1 and the line LINE2 are separated by about 0.2 µm as represented in FIG. 7.

Referring to FIGS. 8A and 8B, it can be seen that the distribution of Sr, Ti and Nb in the STO film 23 along Line 1 and Line 2 is more or less uniform. Further, referring to FIG. 8C, the profile along Line 1 and the profile along Line 2 are overlapping. Thus, it will be noted that the distribution of Sr, Ti and Nb in the direction perpendicular to Line1 and Line 2 is also uniform.

In the transmission electron microscopic image of FIG. 7, the whitish part corresponds to the region of the (031) surface orientation of FIG. 5A.

Experiment 2

In Experiment 2, the specimen of Experiment 1 was annealed in an oxygen ambient for optimization of the power factor PF.

Figure 9:
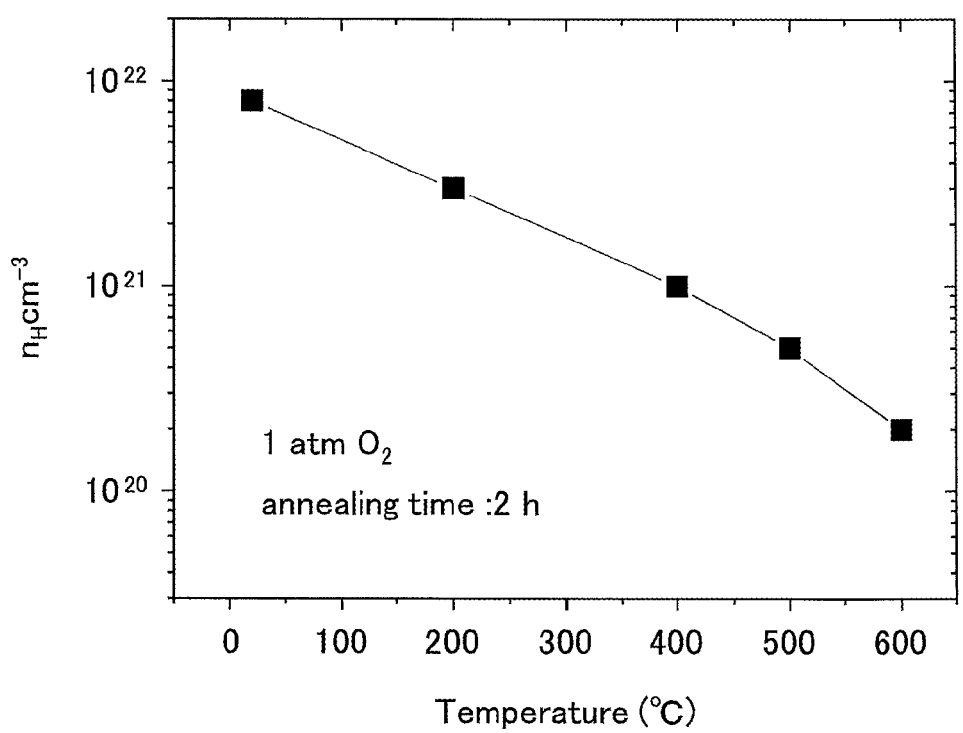
FIG. 9 is a graph representing the relationship between oxygen annealing process and carrier concentration for the STO film of FIG. 2.

FIG. 9 is a graph representing the relationship between the electron density nH in the STO film 23F of the EXPERIMENT 2 obtained by Hall effect and the anneal temperature. In FIG. 9, the vertical axis represents the electron density nH while the horizontal axis represents the anneal temperature.

Referring to FIG. 9, the thermal annealing process is conducted for 2 hours in the oxygen ambient of 1 atmospheric pressure, wherein it can be seen that it is possible to adjust the electron concentration nH in the film in the range of $10^{20}$ cm$^{-3}$-$10^{22}$ cm$^{-3}$ by annealing at the temperature of 600° C. or less. With increase of the electron concentration in the film, there is caused increase in the power factor PF, which is given as PF=$S^2$qnµ as noted in the beginning of the disclosure. FIG. 9 indicates that, with the thermal annealing of the relatively low temperature of 20° C.-600° C. conducted in the oxygen ambient, the oxygen defects, which tend to capture and kill the carriers in the STO film 23F, are effectively compensated for.

Figure 10:
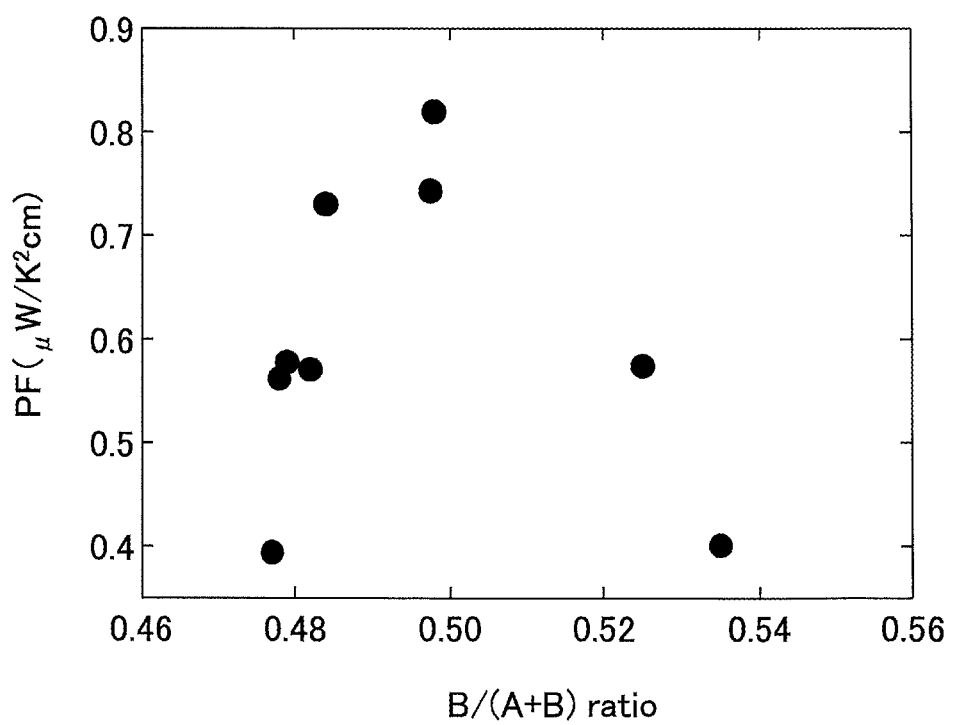
FIG. 10 is a graph representing a power factor for a thermoelectric conversion device of FIG. 11.

FIG. 10 is a graph representing the power factor PF for the case a thermo-electric conversion device to be explained laser is manufactured by using the STO film 23F of the present embodiment.

Referring to FIG. 10, by choosing the ratio B/(A+B) to about 0.50 in the STO film 23F in which the electron concentration $n_H$ is thus optimized, a maximum is attained for the power factor PF. This corresponds to the situation in which there is attained a balance between the total number of atoms of Sr and La occupying the A-sites and the total number of atoms of Ti and Nb occupying the B-sites, and capturing or killing of the carriers by the vacant sites formed in the A-site or B-site is minimized, while this works to maximize the electron density.

It should be noted that the domains of the (031) surface orientation explained with reference to FIGS. 5A and 5B remains in the STO film 23F even after such a thermal annealing process is conducted in the oxygen ambient.

Next, a thermoelectric conversion device 20 according to the present embodiment will be explained with reference to FIG. 11.

Referring to FIG. 11, the thermoelectric conversion device 20 includes, in addition to the monocrystalline STO substrate 13, an STO film 23F formed epitaxially on the STO substrate 13, first electrodes 22A and 22B of an oxidation-resistant metal such as Pt respectively formed in regions near a first end and a second end of the STO film 23F with a thickness of 100 nm, for example, and a second electrode 24 formed on the STO film 23F at an intermediate region between the first end and the second end.

In the thermoelectric conversion device 20 of FIG. 11, there is obtained an output voltage between an output terminal OUT$_1$ connected to the first electrodes 22A and 22B and an output terminal OUT$_2$ connected to the second electrode as a result of Seebeck effect by heating a bottom of the STO substrate 13 at the regions near the first and second ends and further cooling the STO film 23F at the intermediate region, or by cooling the bottom of the STO substrate 13 at the regions near the first and second ends and heating the STO film 23F at the intermediate region.

Further, in the thermoelectric conversion device 20 of FIG. 11, it is also possible to use a monocrystalline substrate of MgO or LaAlO$_3$ in place of the monocrystalline STO substrate 13.

Second Embodiment

Figure 12B:
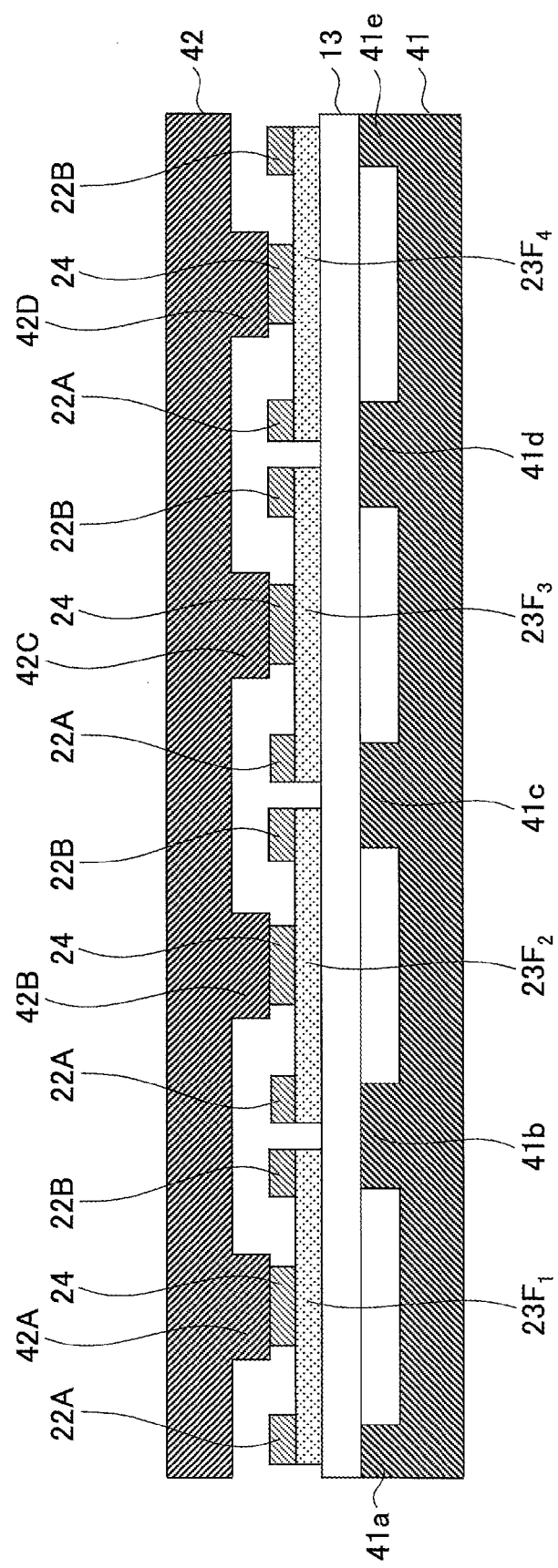
FIG. 12B is a cross-sectional diagram taken along a line A-A' in FIG. 12A.

FIGS. 12A and 12B are plan view and cross-sectional diagrams of a thermoelectric conversion device 40 according to a second embodiment, wherein FIG. 12B is a cross-sectional diagram taken along a line A-A' of the plan view diagram of FIG. 12A.

Referring to FIGS. 12A and 12B, the thermoelectric conversion device 40 includes, in addition to the monocrystalline STO substrate 13, STO film patterns $23F_1$, $23F_2$, $23F_3$ and $23F_4$ formed respectively on the substrate 13 each having a structure identical to that of the STO film 23F of FIGS. 5A and 5B. The STO film pattern $23F_1$, and also other STO film patterns $23F_2$, $23F_3$ and $23F_4$, includes the electrodes 22A and 22B at respective ends.

Further, on the STO substrate 13, there is formed a first wiring $W_1$ to connect the electrodes 22A and 22B in parallel with each other on the STO film pattern $23F_1$ and further to connect to the electrode 24 on the neighboring STO film pattern $23F_2$. Likewise, on the STO substrate 13, there is formed a second wiring $W_2$ to connect the electrodes 22A and 22B in parallel with each other on the STO film pattern $23F_2$ and to connect to the electrode 24 on the neighboring STO film pattern $23F_3$. On the STO substrate 13, there is formed a third wiring $W_3$ to connect the electrodes 22A and 22B parallel with each other on the STO film pattern $23F_3$ and further to connect to the electrode 24 on the neighboring STO film pattern $23F_4$. Further, on the STO substrate 13, there is formed a fourth wiring $W_4$ to connect the electrodes 22A and 22B parallel with each other on the STO film pattern $23F_4$.

Underneath the STO substrate 13, there is disposed a heating/cooling device 41 having projections 41A, 41B, 41C, 41D and 41E such that the projections 41A, 41B, 41C, 41D and 41E make contact respectively with a region 41a, of the STO substrate 13, surrounded by a broken line in FIG. 12A and corresponding to the STO film pattern $23F_1$, a region 41b corresponding to a region bridging from the STO film pattern $23F_1$ to the STO film pattern $23F_2$, a region 41c corresponding to a region bridging from the STO film pattern $23F_2$ to the STO film pattern $23F_3$, a region 41d corresponding to a region bridging from the STO film pattern $23F_3$ to the STO film pattern $23F_4$, and further to a region 41e of the STO substrate 13 corresponding to the STO film pattern $23F_4$. Thus the heating/cooling device 41 works to heat or cool the STO film patterns $23F_1$-$23F_4$ at the regions 41a-41e. The region 41a corresponds to the electrode 22A formed on the STO film pattern $23F_1$, the region 41b corresponds to the electrode 22B formed on the STO film pattern $23F_1$ and the electrode 22A formed on the STO film pattern $23F_2$, the region 41c corresponds to the electrode 22B formed on the STO film pattern $23F_2$ and the electrode 22A formed on the STO film pattern $23F_3$, the region 41d corresponds to the electrode 22B formed on the STO film pattern $23F_3$ and the electrode 22A formed on the STO film pattern $23F_4$, and the region 41e corresponds to the electrode 22B formed on the STO film pattern $23F_4$.

Further, over the STO film patterns $23F_1$-$23F_4$, there is provided a heating/cooling device 42 having projections 42A, 42B, 42C and 42D such that the projections 42A, 42B, 42C and 42D make contact respectively with a region 42a of the STO film pattern $23F_1$, a region 42b of the STO film pattern $23F_2$, a region 42c of the STO film pattern $23F_3$ and a region 41d of the STO film pattern $23F_4$, and the heating/cooling device 42 works to cool or heat the STO film patterns $23F_1$-$23F_4$ at the regions 42a-42d. In FIG. 12A, it should be noted that the regions 42a-42d are represented by a broken line. The region 42a corresponds to the electrode 24 formed on the STO film pattern $23F_1$, the region 42b corresponds to the electrode 24 formed on the STO film pattern $23F_2$, the region 42c corresponds to the electrode 24 formed on the STO film pattern $23F_3$ and the region 42d corresponds to the electrode 24 formed on the STO film pattern $23F_4$.

More specifically, the heating/cooling device 42 cools the respective central parts of the STO film patterns $23F_1$-$23F_4$ in the case the heating/cooling device 41 heats the respective end regions of the STO film patterns $23F_1$-$23F_4$ via the STO substrate 13, while in the case the heating/cooling device 41 cools the respective end regions of the STO film patterns $23F_1$-$23F_4$ via the STO substrate 13, the heating/cooling device 42 heats the respective central parts of the STO film patterns $23F_1$-$23F_4$ such that there is induced a lateral temperature gradient in the respective STO film patterns $23F_1$-$23F_4$. Further, an output terminal $OUT_1$ is connected to the electrode 24 of the STO film pattern $23F_1$ and an output terminal $OUT_2$ is connected to the electrodes 22A and 22B of the STO film pattern $23F_4$. With this, it becomes possible to obtain an output voltage equivalent to the case a plurality of the thermoelectric conversion devices 20 each having the construction of FIG. 11 and having any of the STO film patterns $23F_1$-$23F_4$ are connected in series.

While a thermoelectric conversion device is obtained in the preceding embodiments by means of the STO film having a domain structure, it should be noted that such a domain structure can be induced in other perovskite films by means of the high concentration doping, and it becomes also possible to reduce the thermal conductivity κ in a thermoelectric conversion device that uses other perovskite film such as a $BaTiO_3$ film, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:
1. A thermoelectric conversion device, comprising:
a substrate;
a film of a compound having perovskite structure formed over the substrate;
a first electrode formed over the substrate in contact to a top surface of the film at a first region;
a second electrode formed in contact with the top surface of the film at a second region offset from the first region;
a first heating/cooling device that heats or cools said film at the first region; and
a second heating/cooling device that heats or cools the film at the second region, wherein
the second heating/cooling device cools the second region of the film when the first heating/cooling device heats the first region of the film;
the second heating/cooling device heats the second region of the film when the first heating/cooling device cools the first region of the film;
the film includes multiple domains formed in a crystal that constitutes the compound having perovskite structure, the multiple domains having a crystal orientation different from a crystal orientation of the crystal that constitutes the compound having perovskite structure; and
the film comprises $SrTiO_3$ having a (001) surface orientation, and the domains have a (031) surface orientation.

2. The thermoelectric conversion device as claimed in claim 1, wherein the film has a thermal conductivity κ of 2 W/mK or less which is measured by a 3ω method.

3. The thermoelectric conversion device as claimed in claim 2, wherein the film contains at least La (lanthanum) and Nb (niobium) with a proportion of 20 atomic % or more in total.

4. The thermoelectric conversion device as claimed in claim 3, wherein the La occupies an A-site of perovskite structure and the Nb occupies a B-site of perovskite structure.

5. The thermoelectric conversion device as claimed in claim 2, wherein the film contains Nb with a proportion of 25 atomic % or more.

6. The thermoelectric conversion device as claimed in claim 2, wherein the film includes oxygen defects and has a carrier concentration in a range of $10^{20}$ cm$^{-3}$-$10^{22}$ cm$^{-3}$.

* * * * *